(12) United States Patent
Shao et al.

(10) Patent No.: US 11,929,477 B2
(45) Date of Patent: Mar. 12, 2024

(54) OPTIMIZATION OF THERMAL MANAGEMENT CONTROL OF LITHIUM-ION BATTERY SYSTEM

(71) Applicant: BAIDU USA LLC, Sunnyvale, CA (US)

(72) Inventors: Shuai Shao, Sunnyvale, CA (US); Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 259 days.

(21) Appl. No.: 17/183,942

(22) Filed: Feb. 24, 2021

(65) Prior Publication Data
US 2022/0271360 A1    Aug. 25, 2022

(51) Int. Cl.
| H01M 10/63 | (2014.01) |
| H01M 10/48 | (2006.01) |
| H01M 10/613 | (2014.01) |
| H01M 10/6556 | (2014.01) |
| H01M 10/6563 | (2014.01) |
| H05K 7/20 | (2006.01) |

(52) U.S. Cl.
CPC ........... *H01M 10/63* (2015.04); *H01M 10/48* (2013.01); *H01M 10/613* (2015.04); *H01M 10/6556* (2015.04); *H01M 10/6563* (2015.04); *H05K 7/20718* (2013.01); *H05K 7/20763* (2013.01); *H01M 2220/10* (2013.01)

(58) Field of Classification Search
CPC ............... H01M 10/613; H01M 10/63; H01M 10/6556; H01M 10/6563; H01M 10/48; H01M 2220/10; H05K 7/20718; H05K 7/20763
See application file for complete search history.

(56) References Cited

FOREIGN PATENT DOCUMENTS

| CN | 112186298 A | 1/2021 |
| EP | 2239811 A1 | 10/2010 |
| JP | 2002191104 A | 7/2002 |
| JP | 2010200604 A | 9/2010 |
| JP | 2013134550 A | 7/2013 |
| JP | 2014049402 A | 3/2014 |
| JP | 2019036385 A | 3/2019 |

OTHER PUBLICATIONS

Hasan, MD Mehedi et al: "Battery Cell Temperature Estimation Model and Cost Analysis of a Grid-Connected PV-BESS Plant", 2019 IEEE Innovative Smart Grid Technologies—Asia (ISGT Asia), IEEE, May 21, 2019, 6 Pages.

*Primary Examiner* — James Lee
(74) *Attorney, Agent, or Firm* — WOMBLE BOND DICKINSON (US) LLP (57) ABSTRACT

A battery system can provide backup power for information technology (IT) equipment. In response to a lithium ion based battery being inactive (not charging or discharging), a temperature of the battery can be maintained at or below an optimal storage temperature of the battery, using a primary cooling system. If the primary cooling system is insufficient, the temperature can be maintained at or below the optimal storage temperature with a secondary cooling system that runs in addition to the primary system. The optimal storage temperature of the battery is determined based on an effort to cool the battery and a degradation of the battery.

20 Claims, 5 Drawing Sheets

OPTIMIZATION OF THERMAL MANAGEMENT CONTROL OF LITHIUM-ION BATTERY SYSTEM

FIELD

Embodiments of the present disclosure relate generally to thermal management of a battery system used in a data center or information technology (IT) equipment setting. The thermal management of the battery system can be optimized to reduce degradation of the battery system and the effort required to cool the battery under active and inactive conditions.

BACKGROUND

Information Technology (IT) includes technology such as computers that are accessible through the internet or a local network, which provide storage of, or access to, data, websites, computer programs, and more.

IT equipment such as servers may perform critical operations that are required to be operational even when grid-power becomes unavailable (e.g., during a power-outage or maintenance). Lithium-ion batteries provide essential backup energy that keep IT equipment running for critical operations when a main power source (e.g., a power grid) is down. As such, the availability and functionality of such lithium-ion backup batteries is extremely important and must be maintained.

In some scenarios, a 'battery room' can house all such lithium-ion backup batteries, to centralize management of the batteries. The batteries in this room can provide backup power source to IT equipment when main source is down. Lithium-ion batteries, however, are known to degrade (e.g., reduced energy storage capacity) with the passing of time.

The degradation rate of the battery typically depends on storage temperature of the battery. Higher storage temperature typically leads to a faster degradation, yet it requires less cooling effort for the facility to maintain this storage temperature. Thus, there is a need within development of data centers to manage the batteries in a manner that accounts for battery degradation as well as cooling effort of the battery.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required fora given aspect.

DETAILED DESCRIPTION

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

An optimal battery storage temperature and an operating battery temperature can be maintained to achieve optimal management of lithium-ion backup battery in data center that minimizes a total cost of managing the batteries. A total cost of lithium-ion battery utilization in data center can be determined based on 1) a cost of cooling the battery storage room, 2) a cost due to degradation of the battery, and 3) the cost of cooling the battery when it is active (e.g., charging or discharging). Each 'cost' can be described as a power consumption (e.g., the power required to operate cooling equipment such as fans, pumps, or compressors), a monetary value, and/or a normalized value indicating a general effort or a harm.

An optimal storage temperature is determined that considers tradeoff between facility cooling costs for storage and battery degradation. A minimum cost for cooling the battery while it is in charging or discharging can be achieved by maintaining the battery temperature up to an upper temperature limit of the battery. Real-time battery room ambient temperature and battery temperatures can be monitored in multiple locations. A primary cooling system such as a fan or coolant-based system can then be controlled cool the battery just enough during operation so that the battery temperature is kept up to the upper temperature limit. This temperature limit can vary based on battery specification (e.g., cell construction and chemistry) and is typically made available by cell or battery module manufacturer.

In some embodiments, a data center includes a lithium-ion backup battery which can include one or more battery modules, each of which contain a plurality of lithium ion cells. The battery can be stored in a battery room for centralized management. The cost of maintaining the battery at a desired temperature can be determined based on power consumption required by fans, compressors, or a pump of a coolant-based cooling systems. Such a cost can vary based on infrastructure of the data center facility, the number of batteries, size of room, and outdoor air temperature. Typically, as the desired temperature decreases, the cost of cooling the facility increases.

For a given data center, the outdoor air temperature can be assumed to be consistent with historical data. Thus, an annual operation cost of facility can be considered as a function of storage temperature for batteries, given by:

$$C_{facility}(T_{storage}) = C_{fan}(T_{storage}) + C_{compressor}(T_{storage}),$$

where $T_{storage}$ is room ambient temperature, $C_{facility}$ is facility cooling, $C_{fan}(T_{storage})$ is a cost of operating the fan to maintain the $T_{storage}$, and $C_{compressor}(T_{storage})$ is the cost of operating the compressor to maintain the ambient temperature at $T_{storage}$. As discussed, in some instances, instead of a fan, the system can include a coolant-based cooling system that includes a pump that circulates coolant through a cold-plate that transfers thermal energy from the batteries.

Figure 1:
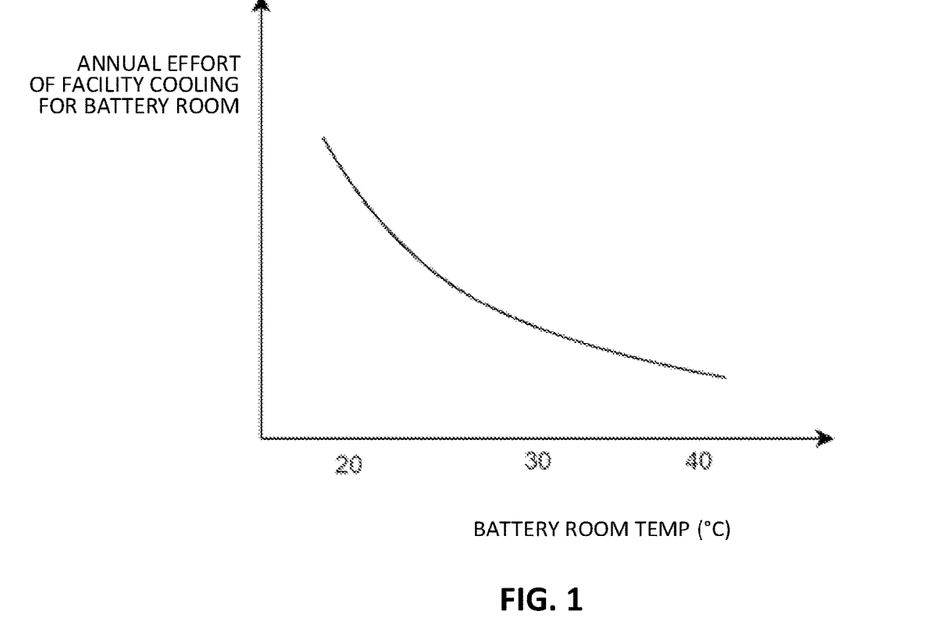
FIG. 1 shows a relationship between cooling effort and battery room temperature.

FIG. 1 shows a graph depicting a relationship between annual effort (e.g., cost) and battery room temperature. As shown, the lower the temperature setpoint is, the higher the effort required to cool the battery room. Conversely, as the temperature setpoint increases, less effort is required to cool the battery room. In a data center, lithium-ion batteries can be stored in a common battery room for unified management. The ambient temperature of the battery room is controlled by the facility cooling settings.

Figure 2:
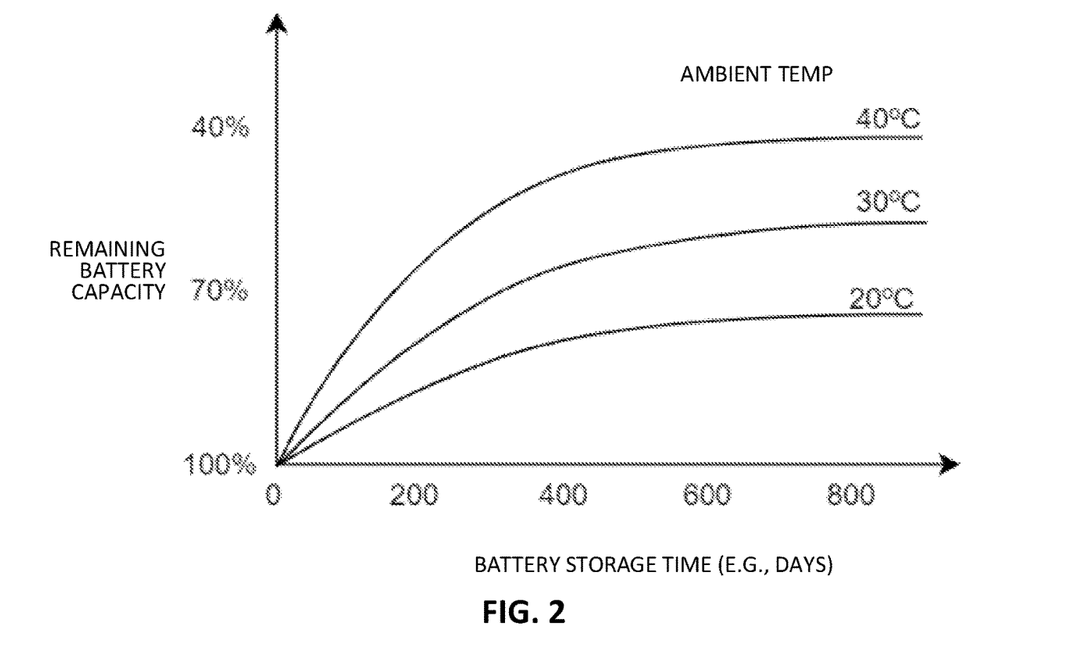
FIG. 2 shows relationships between battery storage capacity, ambient temperature, and storage time, according to some embodiments.

FIG. 2 shows relationship between battery capacity (how much energy the battery can store), ambient temperature that the battery is stored in, and total storage time. Some observations can be made based on the figure.

First, the Lithium ion battery has a decreasing discharging capacity as it is stored. Each battery degrades as time passes, even when the battery is not used. Eventually, the battery capacity will be too low to meet the requirement of data center. For example, a data center may require energy storage that is capable of providing 24 hours of back-up. After a certain amount of days, due to degradation, the batteries will need to be replaced.

Second, lower ambient temperature helps storage of battery last longer. Typically, the lifetime of lithium ion battery is 15 years. But higher ambient temperature of battery storage can significantly shorten the useable life of the battery. Thus, although there is an increase in power consumption to cool the battery room, there is a savings in terms of improving battery health.

One way to capture the cost of battery degradation is as a capital expense. A battery capital expense is denoted as $C_{battery,capex}$, nominal life time is denoted as $t_{battery,nominal}$ (for example, $t_{battery,nominal}=15$ years), the actual lifetime of battery is denoted as $\eta \cdot t_{battery,nominal}$, where $\eta$ is the coefficient indicating the impact of storage temperature on battery life. $\eta$ is a function of temperature (e.g., storage temperature) and $\eta=1$ can be defined using a nominal storage temperature of 20° C.

For example, a company requires to replace the battery when its capacity drops below 70% (number depending on specific technical requirement) of the initial capacity. Considering the impact of store temperature, the battery life can be described by $\eta \cdot t_{battery,nominal}$. The annual expense due to battery degradation $C_{battery,degrade}$ can thus be expressed as $$C_{battery,degrade} = \frac{C_{battery,capex}}{t_{battery,nominal} \times \eta}.$$

As discussed, $\eta$ is a function of storage temperature $T_{storage}$, and the value of $\eta$ decreases as the storage temperature of the battery increases. As such, a higher annual battery cost results in a higher storage temperature.

As mentioned, FIG. 2 shows a relationship between battery storage time, storage temperature, and remaining battery energy storage capacity. A unique relationship between storage time and storage capacity can exist for different ambient storage temperatures (e.g., 20° C., 30° C., 40° C., and so on).

Figure 3:
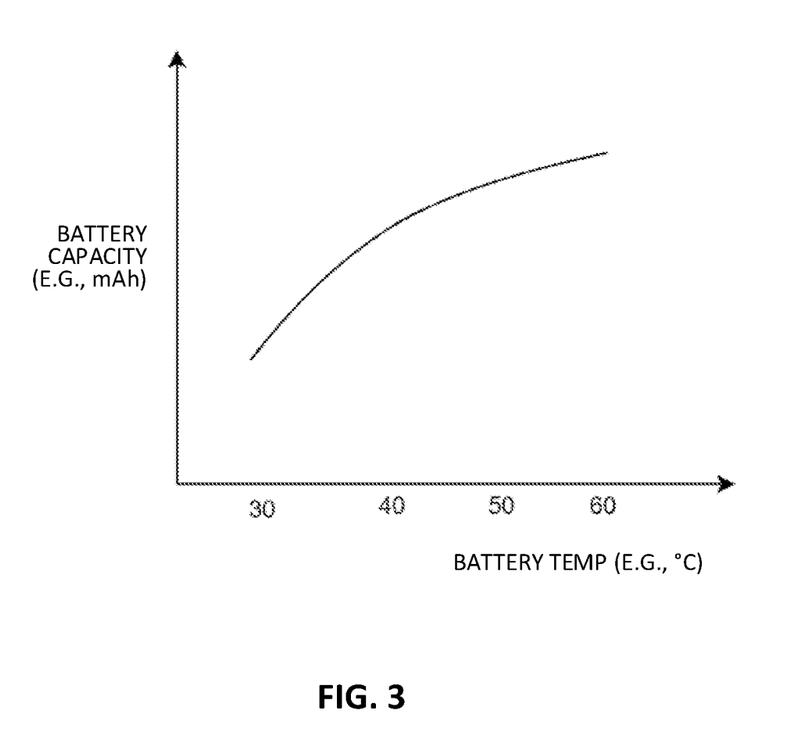
FIG. 3 shows a relationship between charge or discharge capacity and battery temperature.

FIG. 3 shows a relationship between the battery capacity and battery temperature during operation. Typically, as the battery temperature is increased during operation, the battery capacity also increases. In other words, battery performance can benefit from increased battery temperature. As such, during operation, cooling efforts can be minimized to maintain the battery to below a threshold, such as the upper temperature limit of the battery. The upper temperature limit can be a manufacturer defined limit such a temperature that the battery can be operated without risk of overheating the battery. It can be determined through test and repetition and is typically provided by a battery manufacturer.

An operational cost of using the lithium-ion batteries can be determined as the cost of cooling the battery during battery charging/discharging. This can be performed using a primary cooling device such as, for example, a fan or a liquid/cold plate technology. The operational cost could be a power consumption of a primary cooling system, e.g., of the fan or for a pump used to circulate the coolant. The primary cooling system can be applied at the lowest possible setting to maintain the battery below a maximum allowable temperature. This is because higher battery temperature results in increasing the battery charge/discharge capacity, thus actually improving performance, while minimizing the cooling effort.

Thus, based on the above, a total cost $C_{total}$ for battery operation can be determined as follows:

$$C_{total} = C_{facility} + C_{battery,degrade} + C_{operation}.$$

In other words, the total cost depends a) the cost of cooling the batteries when inactive (not charging/discharging), b) the cost of battery degradation, and c) the cost to cool the batteries when the batteries are active. Higher storage temperature leads to lower $C_{facility}$ but increased $C_{battery,degrade}$. On the other hand, lower storage temperature leads to higher $C_{facility}$ but decreased $C_{battery,degrade}$. For $C_{operation}$ higher battery temperature leads to higher battery charge/discharge capacity, thereby improving performance. Note that the battery temperature should be lower than its upper limit to prevent overheating.

In some embodiments, the optimized storage temperature T storage is determined such that the sum of a) the effort or cost of cooling the battery room, and b) an effort or cost due to battery degradation, is minimized. The battery degradation can be fitting into the following analytical relation: $y = A \cdot \exp(-x/B)$, where x is the storage time and y is the remaining battery capacity. Historical data such as the remaining battery capacity y, and the storage time x can be gathered through testing. The least square method can be applied using this data to fit the constants A and B. Using this equation the actual lifetime of the battery can be predicted and we can obtain $\eta$.

Then, the sum of the cost of facility cooling for the battery room and the cost from battery degradation for each possible temperature setting can be obtained. One example is shown as below, where for different storage temperatures, there is a corresponding facility cooling cost, and a corresponding cost due to battery degradation.

$T_{storage,1}$: $C_{facility,1} + C_{battery,degrade,1}$ $T_{storage,2}$: $C_{facility,2} + C_{battery,degrade,2}$

...

$T_{storage,10}$: $C_{facility,10} + C_{battery,degrade,10}$

Base on the different values from the different storage temperatures, an optimal storage temperature can be selected. This optimal storage temperature is the storage temperature that results in the lowest cost (e.g., computed as a sum of the cooling cost and battery degradation). The relationships shown in FIG. 2 can be provided in a manufacturer's battery specification, which can then be used to obtain the optimized $T_{storage}$. In some embodiments, where the relationships are not provided readily, a number of unused batteries, can be monitored under different storage temperatures over time to produce a corresponding relationship between storage capacity and storage time for the given storage temperature. In either case, the optimal storage temperature $T^*_{storage}$ can be obtained as having the minimal combined cost ($C_{facility}+C_{battery,degrade}$).

In other words, the optimal storage temperature of the battery can be determined by minimizing a sum of a) the effort to cool the battery (when inactive) and b) the degradation of the battery, which is a function of battery storage temperature. The effort to cool the battery can be a sum of an estimated operating effort of a) the primary cooling system (such as fans, or a coolant-based system), and b) the compressor. Further, the degradation of the battery is determined based on at least a nominal battery temperature (e.g., 20° C.), and the optimal storage temperature, as discussed in other sections with regard to the relationship $$C_{battery,degrade} = \frac{C_{battery,capex}}{t_{battery,nominal} \times \eta}.$$

Optimal control for a primary cooling system (e.g., an optimal fan speed or pump speed) can be determined and applied during battery activity (e.g., charge/discharge). This optimal control, over the duration of activity time, results in the total operation cost of the lithium-ion batteries. The real time battery temperatures can be monitored in multiple locations. For example, temperature sensors can be located on one or more battery cells, a battery housing, a chassis, thermal plate, etc. In some embodiments, the highest temperature value can be used to perform the control for the cooling systems. The primary cooling system is controlled so that the battery temperature remains below the upper temperature limit of the battery.

Figure 4:
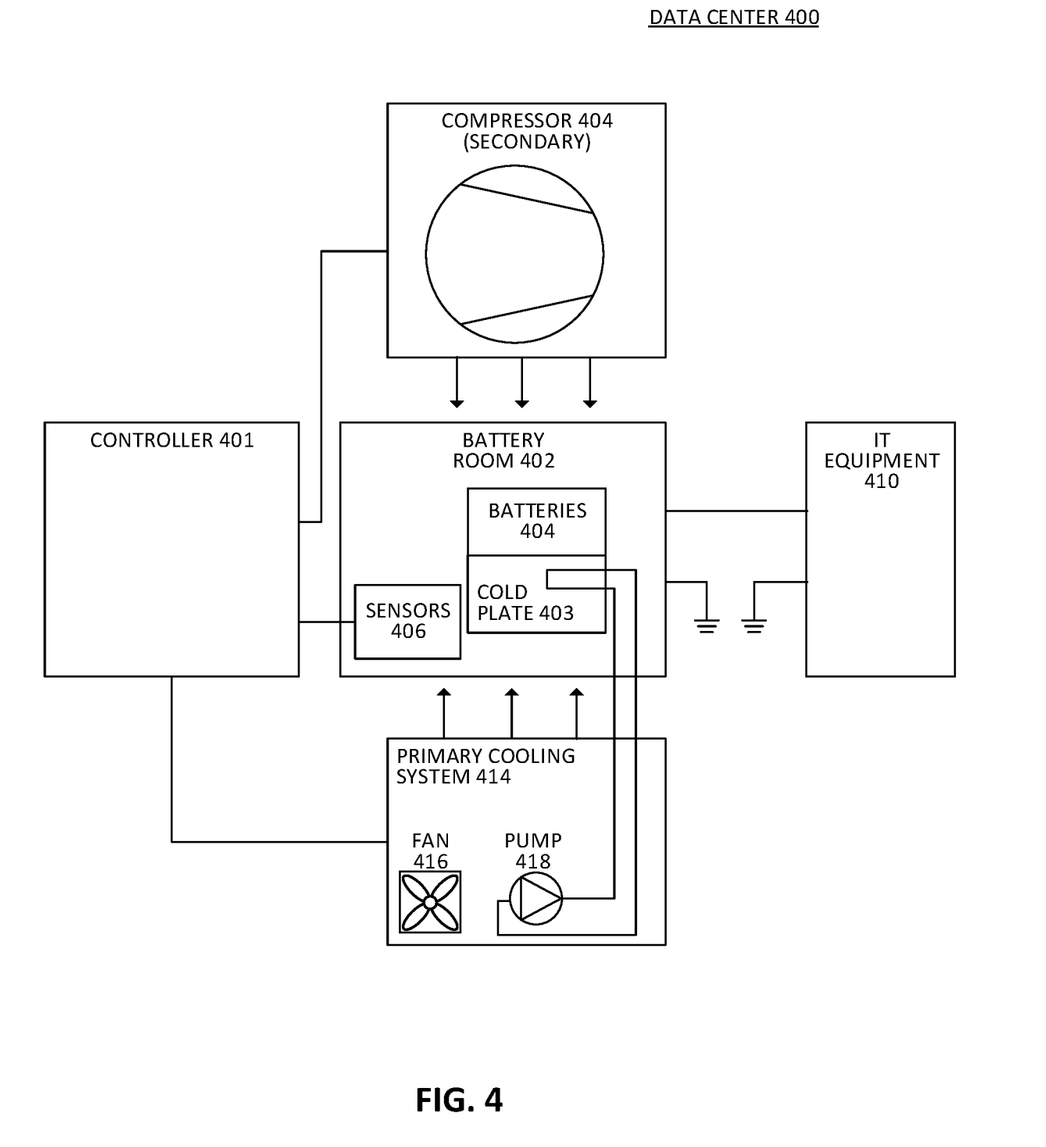
FIG. 4 shows a data center, according to some embodiments.

FIG. 4 shows a block diagram of a data center 400, according to some embodiments. The data center can include a cooling system that comprises a controller 401, a primary cooling system 414, and a secondary cooling system 404. The primary cooling system can include a lower cost and/or higher efficiency technique than the secondary cooling system. Thus, the primary cooling system is used as the default cooling system while the secondary cooling system is used to as a supplement (e.g., when the primary cooling system is insufficient or needs help).

The primary cooling system 414 can include one or more fans 416 that blow air through battery room 402, where LI batteries 404 are located. Alternatively, or additionally, the primary cooling system includes a pump 418 that circulates a coolant to and from the batteries. For example, the coolant can be thermally coupled to a cold plate 403 to absorb thermal energy from the batteries.

A secondary cooling system 404 can include a compressor and other standard air conditioner components that chill the air of the battery room using compressor/condenser technology. As discussed, this secondary cooling system tends to require more effort (e.g., power consumption) than the primary cooling system, and is thus used as a backup, in addition to the primary cooling system. In some embodiments, instead of a compressor, another facility cooling solution such as, for example, IDEC (indirect evaporative cooling), is used. In some embodiments, any secondary cooling system that produces air that is colder than the outside air temperature can be used.

Sensors 406 can include one or more temperature sensors that monitor temperatures of battery cells and/or ambient temperature of the battery room. The sensors can also include other information such as voltage, current, and/or other telemetry.

Figure 5:
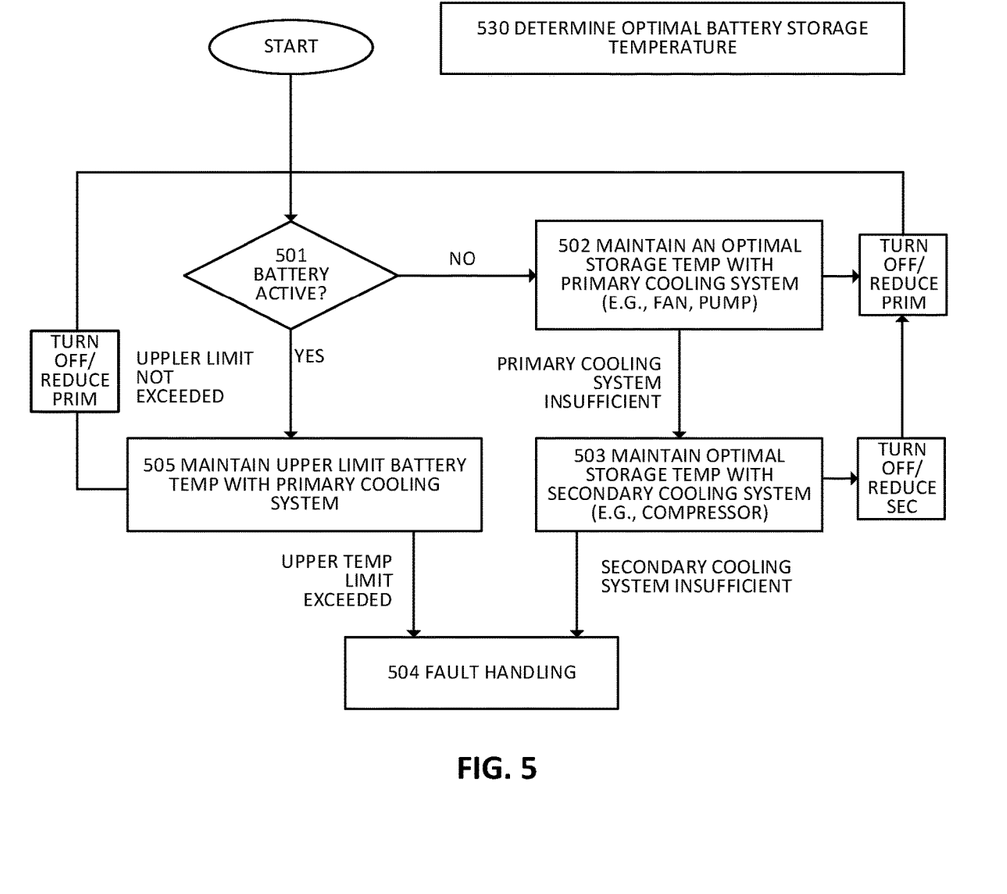
FIG. 5 shows a method of managing battery conditions, according to some embodiments.

A controller 401 can include a combination of hardware (e.g., a processor, programmable logic arrays, computer-readable memory) that is configured to perform control operations described herein (e.g., in FIG. 5). The controller can include one or more output signals that control the primary cooling system and secondary cooling system (e.g., commanding them ON/OFF, or to different speeds or efforts) based on inputs received from sensors 406. The inputs can include the sensed temperature of the cells of the battery, and current measurements that determine whether the battery is active (e.g., charging or discharging) or inactive (not charging and not discharging). Inputs and outputs can be communicated through known technology such as TCP/IP, RS232, RS485, CAN-BUS, Wi-Fi, LTE, etc.

In some embodiments, the primary cooling system and/or secondary cooling system can have variable control levels. For example, the primary cooling system can have variable fan speed or pump speed. Similarly, the secondary cooling system can have variable compressor speed control. In other embodiments, the primary cooling system and/or secondary cooling system have a simple binary control (e.g., ON/OFF) interface.

It should be understood that the battery 404 can include a plurality of battery modules. Each battery module can include a plurality of LI battery cells. The battery can be electrically connected to IT equipment 410 to serve as backup power, in case the primary power (e.g., grid) is lost. In some embodiments, although not shown, the batteries can connect to a power inverter to convert DC to AC (e.g., 120 VAC, 240 VAC, etc.) to power the IT equipment.

FIG. 5 shows a method which can be performed by a cooling system controller such as controller 401, to manage a battery system that is arranged as backup power for information technology (IT) equipment.

At operation 501, it is determined whether or not the batteries are active or not. For example, information from one or more current sensors can be used to determine if the batteries are charging, discharging, or idle. In other words, if the current is zero, then the batteries are inactive. If the current is greater or less than zero, then the batteries are discharging or charging (active).

In response to a lithium ion based battery being currently inactive, the method can proceed to operation 502. At operation 502, the method includes maintaining a temperature of the battery at or below an optimal storage temperature of the battery with a primary cooling system. For example, the controller can command the fan (or pump) to operate at maximum speed until the battery temperature is at or below the optimal storage temperature. When the optimal storage temperature is reached, the fan can be turned off or reduced, and control can pass to operation 101 to repeat the cycle of maintaining the optimal storage temperature.

In some embodiments, a variable speed command can be given to the fan or pump, the variable speed command being proportional to a difference between the battery temperature and the optimal storage temperature. For example, if the battery temperature is only slightly above the optimal storage temperature (e.g., 1 degree, 2 degrees), then the fan or pump need only operate at a low setting (e.g., 25%, 50%). If the battery temperature is substantially above the optimal storage temperature (e.g., 5 degrees or more), then the fan or pump may be commanded to a high setting (e.g., 80% or 100%). The battery temperature can be determined based on the hottest of a plurality of temperatures taken at different battery cells, or a weighted average of the battery cells.

Under some circumstances, the fan or pump alone are insufficient to cool the batteries, such as, for example, when the outside air is very hot. The battery temperature can be monitored such that, if it does not decrease, or does not decrease at a desirable rate, then the primary cooling system may be deemed insufficient to maintain the optimal storage temp. If the primary cooling system is deemed insufficient, then the method can proceed to block 503.

At block 503, the method includes maintaining the temperature of the battery at or below the optimal storage temperature of the battery with a secondary cooling system, such as a compressor, or other equivalent air-cooling technology. At this stage, both the primary and secondary cooling system can be working to maintain the optimal storage temperature of the battery. The battery temperature can be monitored over time and, if the battery temperature decreases to at or below the optimal storage temperature, then the secondary cooling system can be turned off or reduced. The primary cooling system can also be turned off or reduced. The method can proceed to operation 501 to thereby repeat the process of maintaining the optimal storage temperature. If the battery temperature does not decrease or does not decrease at a satisfactory rate, then the system can proceed to fault handling operation 504.

At block 505, in response to the battery being deemed as active, the method includes maintaining the temperature of the battery at an upper temperature limit of the battery using minimal effort of the primary cooling system. In other words, the system can use the lowest fan speed or pump speed that is required to maintain the battery under safe operating conditions. This reduces the cooling effort (e.g., cost, power consumption) while also improving the charge and discharge capacity of the battery. In some embodiments, if the upper temperature limit is exceeded, then the method may proceed to block 504 to perform fault handling. Otherwise, the method can proceed back to operation 501 to repeatedly maintain the upper limit battery temperature when the battery is active.

In such a manner, the method uses the primary cooling system (e.g., fan or pump) to maintain the storage temperature, and only uses compressor when and if it is required, for example, when the optimal storage temperature is below outdoor air temperature and facility fan speed has reached its maximum. The compressor is then started and the working frequency of compressor is reduced as much as possible to maintain the optimal storage temperature.

As described, the optimal storage temperature of the battery is determined based on a) an effort to cool the battery and b) a degradation of the battery. The optimal storage temperature results in a minimum of the sum of the cooling effort and the degradation, given that the effort to cool the battery increases as the optimal storage temperature is decreased but the degradation of the battery increases as the optimal storage temperature is increased. This optimal storage temperature can be determined at operation 530 which can be performed off-line at any time, and/or stored as a setting in computer-readable memory of the controller.

At operation 504, the method can include reporting an error of the battery (e.g., logging a fault to a fault log and/or to the cloud) or performing a system shut down in response to when a) an upper temperature limit of the battery is exceeded, orb) when the optimal storage temperature of the battery is exceeded under operation of the compressor and the primary cooling system. System shut down can include removing power to the IT equipment which can prevent battery overheating. If the battery is not active, then only error reporting is necessary. In some embodiments, the remedial response can include requesting an immediate response from an operator (e.g., through an electronic notification).

Figure 6:
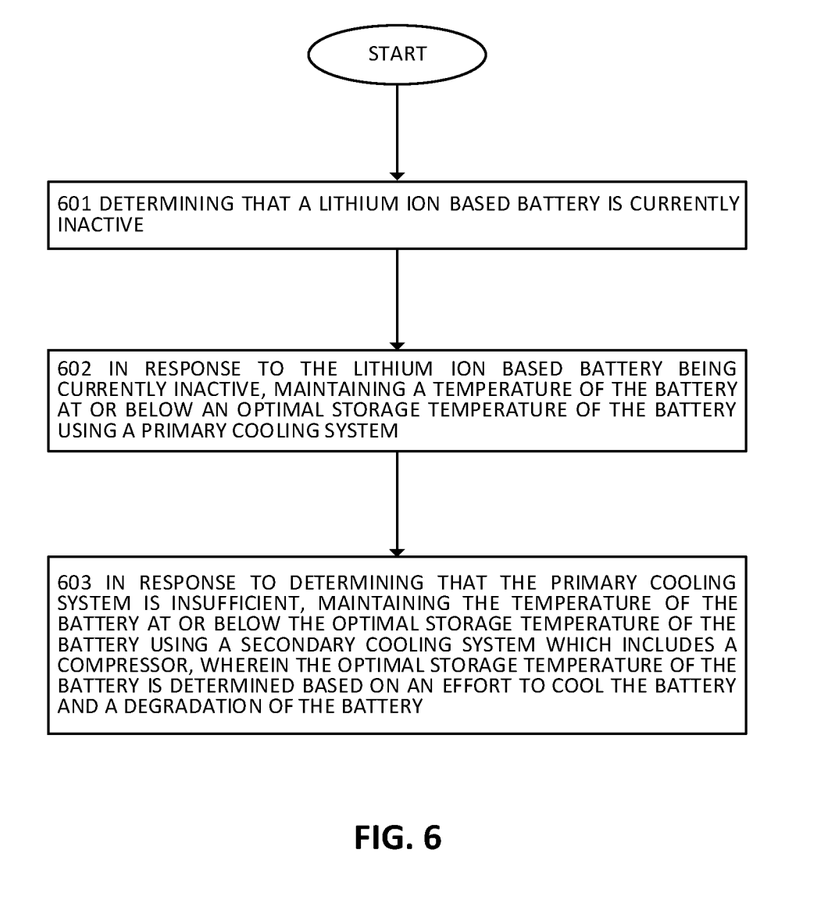
FIG. 6 shows a flow chart of managing battery conditions, according to some embodiments.

FIG. 6 shows a flow diagram for managing battery conditions, according to some embodiments. The battery system can be arranged as an energy source for IT equipment. At operation 601, the method includes determining that a lithium ion based battery is currently inactive. At operation 602, the method includes, in response to the lithium ion based battery being currently inactive, maintaining a temperature of the battery at or below an optimal storage temperature of the battery using a primary cooling system. At operation 603, the method includes, in response to determining that the primary cooling system is insufficient, maintaining the temperature of the battery at or below the optimal storage temperature of the battery using a secondary cooling system which includes a compressor. The optimal storage temperature of the battery can be determined based on an effort to cool the battery and a degradation of the battery, as described in other sections.

Some embodiments may include a non-transitory machine-readable medium (such as microelectronic memory) having stored thereon instructions, which program one or more data processing components (generically referred to here as a "processor") to perform temperature control operations. In some embodiments, temperature control operations can be performed using known control techniques such as a proportional integral (PI) controller, a proportional integral differential (PID) controller, or other equivalent control techniques that utilize the battery temperature as feedback.

In some embodiments, an optimal battery storage temperature is configurable (e.g., it is stored as a setting in computer readable memory). In some embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it into be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]."

This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A method for managing a battery system for information technology (IT) equipment, comprising:
   determining that a lithium ion based battery is inactive; and
   in response to the lithium ion based battery being inactive,
   a) maintaining, while the battery is inactive, a temperature of the battery at or below an optimal storage temperature of the battery using a primary cooling system, wherein the optimal storage temperature of the battery is determined based on selecting from a plurality of storage temperatures each of which having computed a sum of i) a cost associated with a power consumption used to cool the battery, and ii) a cost associated with a degradation of a capacity of the battery, wherein the optimal storage temperature is selected from the plurality of storage temperatures, and
   b) in response to determining that the primary cooling system does not decrease the temperature of the battery, maintaining the temperature of the battery at or below the optimal storage temperature of the battery using a secondary cooling system which includes a compressor, while the battery is inactive.

2. The method of claim 1, further comprising, in response to the battery being active, maintaining the temperature of the battery at an upper temperature limit of the battery to reduce a power consumption of the primary cooling system while the battery is active.

3. The method of claim 1, wherein the degradation of the capacity of the battery is a function of battery storage temperature.

4. The method of claim 1, wherein the power consumption used to cool the battery comprises a sum of a) a first power consumption of the primary cooling system, and b) a second power consumption of the compressor.

5. The method of claim 1, wherein the capacity of the battery degrades over time at a rate dependent on a storage temperature of the battery relative to a nominal battery temperature of the battery of 20 degrees Celsius.

6. The method of claim 1, wherein the first primary system includes a) a fan or b) a cold plate that circulates a coolant.

7. The method of claim 1, further comprising reporting an error of the battery or performing a system shut down in response to when a) an upper temperature limit of the battery is exceeded or b) when the optimal storage temperature of the battery is exceeded under operation of the compressor and the primary cooling system.

8. A cooling system for a lithium ion based battery provides back-up power to information technology (IT) equipment, comprising:
   a primary cooling system;
   a secondary cooling system; and
   a controller coupled to the primary and secondary cooling systems, the controller configured to perform operations, the operations including
   determining that the lithium ion based battery is inactive, and
   in response to determining the lithium ion based battery being inactive,
   a) maintaining, while the battery is inactive, a temperature of the battery at or below an optimal storage temperature of the battery with a primary cooling system, wherein the optimal storage temperature of the battery is determined based on selecting from a plurality of storage temperatures each of which having computed a sum of i) a cost associated with a power consumption used to cool the battery, and ii) a cost associated with a degradation of a capacity of the battery, wherein the optimal storage temperature is selected from the plurality of storage temperatures based on having a lowest sum among the sums computed for the plurality of storage temperatures, and
   b) in response to determining that the primary cooling system does not decrease the temperature of the battery, maintaining the temperature of the battery at or below the optimal storage temperature of the battery with the secondary cooling system which includes a compressor, while the battery is inactive.

9. The cooling system of claim 8, wherein the operations further comprise, in response to the battery being currently active, maintaining the temperature of the battery at an upper temperature limit of the battery to reduce a power consumption of the primary cooling system while the battery is active.

10. The cooling system of claim 8, wherein the degradation of the capacity of the battery is a function of battery storage temperature.

11. The cooling system of claim 8, wherein the power consumption used to cool the battery comprises a sum of a) a first power consumption of the primary cooling system, and b) a second power consumption of the compressor.

12. The cooling system of claim 8, wherein the capacity of the battery degrades over time at a rate dependent on a storage temperature of the battery relative to a nominal battery temperature of the battery of 20 degrees Celsius.

13. The cooling system of claim 8, wherein the first primary system includes a) a fan or b) a cold plate that circulates a coolant.

14. The cooling system of claim 8, wherein the operations further comprise reporting an error of the battery or performing a system shut down in response to when a) an upper temperature limit of the battery is exceeded or b) when the optimal storage temperature of the battery is exceeded under operation of the compressor.

15. A data center, comprising:
   a lithium ion based battery coupled to information technology (IT) equipment; and
   a cooling system having a primary cooling system, a secondary cooling system and a controller, wherein the controller is configured to perform operations, the operations including:
   determining that the lithium ion based battery is inactive, and
   in response to the lithium ion based battery being inactive,
   a) maintaining, while the battery is inactive, a temperature of the battery at or below an optimal storage temperature of the battery the primary cooling system, wherein the optimal storage temperature of the battery is determined based on selecting from a plurality of storage temperatures each of which having computed a sum of i) a cost associated with a power consumption used to cool the battery, and ii) a cost associated with a degradation of a capacity of the battery, wherein the optimal storage temperature is selected from the plurality of storage temperatures based on having a lowest sum among the sums computed for the plurality of storage temperatures, and b) in response to determining that the primary cooling system does not decrease the temperature of the battery, maintaining the temperature of the battery at or below the optimal storage temperature of the battery with the secondary cooling system which includes a compressor, while the battery is inactive.

16. The data center of claim 15, wherein the operations further comprise, in response to the battery being active, maintaining the temperature of the battery at an upper temperature limit of the battery to reduce a power consumption of the primary cooling system while the battery is active.

17. The data center of claim 15, wherein the degradation of the capacity of the battery is a function of battery storage temperature.

18. The data center of claim 15, wherein the power consumption used to cool the battery comprises a sum of a) a first power consumption of the primary cooling system, and b) a second power consumption of the compressor.

19. The data center of claim 15, wherein the capacity of the battery degrades over time at a rate dependent on a storage temperature of the battery relative to a nominal battery temperature of the battery of 20 degrees Celsius.

20. The data center of claim 15, wherein the first primary system includes a) a fan or b) a cold plate that circulates a coolant.

\* \* \* \* \*